(12) United States Patent
Katsumura et al.

(10) Patent No.: US 9,525,365 B2
(45) Date of Patent: Dec. 20, 2016

(54) POWER-GENERATING DEVICE WITH VIBRATION PLATE THAT APPLIES COMPRESSIVE STRESS TO THE PIEZOELECTRIC LAYER WHEN THE VIBRATION PLATE DOES NOT VIBRATE

(71) Applicant: Panasonic Intellectual Property Management Co., Ltd., Osaka (JP)

(72) Inventors: Hidenori Katsumura, Hyogo (JP); Hiroshi Kagata, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/442,722

(22) PCT Filed: Oct. 30, 2013

(86) PCT No.: PCT/JP2013/006418
§ 371 (c)(1),
(2) Date: May 14, 2015

(87) PCT Pub. No.: WO2014/076895
PCT Pub. Date: May 22, 2014

(65) Prior Publication Data
US 2015/0303835 A1    Oct. 22, 2015

(30) Foreign Application Priority Data

Nov. 19, 2012  (JP) ................................. 2012-252952

(51) Int. Cl.
*H01L 41/113* (2006.01)
*H02N 2/18* (2006.01)

(52) U.S. Cl.
CPC ........... *H02N 2/186* (2013.01); *H01L 41/1136* (2013.01); *H02N 2/188* (2013.01)

(58) Field of Classification Search
CPC  H01L 41/0933; H01L 41/094; H01L 41/1134; H01L 41/1136; H03H 9/17; H03H 9/2447; H03H 9/2452; H03H 9/2457; H03H 9/2463; B06B 1/0603
(Continued)

(56) References Cited

U.S. PATENT DOCUMENTS

| 5,801,475 A | * | 9/1998 | Kimura | ................. | H02N 2/181 310/319 |
| 2005/0168108 A1 | * | 8/2005 | Face | ................. | H01H 13/7006 310/330 |

(Continued)

FOREIGN PATENT DOCUMENTS

| EP | 1796256 | 6/2007 |
| JP | 2001-125032 | 5/2001 |

(Continued)

OTHER PUBLICATIONS

International Search Report of PCT application No. PCT/JP2013/006418 dated Feb. 10, 2014.
(Continued)

*Primary Examiner* — J. San Martin
(74) *Attorney, Agent, or Firm* — McDermott Will & Emery LLP

(57) ABSTRACT

A power-generating device includes a vibration plate, a lower electrode on the vibration plate, a piezoelectric layer made of piezoelectric material on the lower electrode, and an upper electrode on the piezoelectric layer, a fixing member for supporting a fixed end of the vibration plate. The vibration plate applies compressive stress to the piezoelectric layer when the vibration plate does not vibrate. The power generating device is excellent in long-term reliability.

20 Claims, 11 Drawing Sheets

(58) Field of Classification Search
USPC .......................................... 310/330–332, 339
See application file for complete search history.

(56) References Cited

U.S. PATENT DOCUMENTS

| | | | |
|---|---|---|---|
| 2005/0210988 A1 | 9/2005 | Amano et al. | |
| 2006/0021261 A1* | 2/2006 | Face | H02N 2/18 36/132 |
| 2007/0114890 A1* | 5/2007 | Churchill | H01L 41/1136 310/339 |
| 2008/0136562 A1* | 6/2008 | Kulah | F03G 7/00 333/186 |
| 2008/0264537 A1* | 10/2008 | Behrends | B60C 23/041 152/152.1 |
| 2009/0261689 A1* | 10/2009 | Fang | H02N 2/186 310/319 |
| 2009/0315431 A1* | 12/2009 | Rastegar | H02N 2/18 310/331 |
| 2011/0148256 A1 | 6/2011 | Fujimoto | |
| 2011/0221307 A1* | 9/2011 | Liu | B81B 3/0072 310/325 |
| 2011/0233693 A1* | 9/2011 | Perruchot | B81B 3/0072 257/417 |
| 2012/0267982 A1* | 10/2012 | Carman | H02N 2/186 310/318 |
| 2013/0154439 A1* | 6/2013 | Lee | H01L 41/1136 310/314 |
| 2013/0320807 A1 | 12/2013 | Sakaguchi et al. | |

FOREIGN PATENT DOCUMENTS

| | | |
|---|---|---|
| JP | 2005-252258 | 9/2005 |
| JP | 2006-158113 | 6/2006 |
| JP | 2007-282355 | 10/2007 |
| JP | 2008-211396 | 9/2008 |
| JP | 2010-063321 | 3/2010 |
| WO | 2010/029715 | 3/2010 |
| WO | 2012/137695 | 10/2012 |

OTHER PUBLICATIONS

The Extended European Search Report dated Nov. 12, 2015 for the related European Patent Application No. 13855368.0.

* cited by examiner

POWER-GENERATING DEVICE WITH VIBRATION PLATE THAT APPLIES COMPRESSIVE STRESS TO THE PIEZOELECTRIC LAYER WHEN THE VIBRATION PLATE DOES NOT VIBRATE

This application is a U.S. national stage application of the PCT international application No. PCT/JP2013/006418 filed on Oct. 30, 2013, which claims the benefit of foreign priority of Japanese patent application 2012-252952 filed on Nov. 19, 2012, the contents all of which are incorporated herein by reference.

TECHNICAL FIELD

The present invention relates to a power-generating device that changes mechanical energy to electric energy by using piezoelectric effect.

BACKGROUND ART

A piezoelectric power-generating device is known as a power-generating device that applies mechanical energy, such as acceleration or distortion externally, to an element made of piezoelectric material, so that the mechanical energy is converted to electric energy by piezoelectric effect. Use of electric power generated by this piezoelectric power-generating device to a variety of sensors or a power supply for a low-power wireless communication eliminates wirings and batteries. This is called as "energy harvesting technique", which has been eagerly developed in recent years.

FIG. 11 is a side view of piezoelectric power generating device 500 disclosed in PTL 1. Piezoelectric power generating device 500 includes metal vibrating plate 502 and piezoelectric transducer vibrator 501 including piezoelectric board 503 fixed to a main surface of metal vibration plate 502. A root portion of piezoelectric transducer vibrator 501 is fixed to a fixing portion, such as a housing.

Piezoelectric power generating device 500 further includes magnet 505 mounted to a free end of vibrator 501, and movable element 506. An operator moves movable element 506 along direction D500 to cause vibrator 501 to deform due to an attractive force of magnet 505. When a restoring force of deforming vibrator 501 becomes larger than the attractive force, the attracting is released. Vibrator 501 then generates a resonant vibration. The resonant vibration transmits to piezoelectric board 503 and is converted into electric energy, thereby generating electric power.

PTL 1 does not disclose a material of piezoelectric board 503. PTL 2 discloses lead-ZIRCONATE-TITANTE-based piezoelectric ceramics as a preferable material of piezoelectric board 503 having a large piezoelectric constant.

Larger widths of piezoelectric transducer vibrator 501 and piezoelectric board 503 allow piezoelectric power generating device 500 to generate larger electric power; however, this structure is not preferable since it enlarges the total dimensions of piezoelectric power generating device 500.

A larger attractive force of each of magnet 505 and movable element 506 increase a displacement amount of vibrator 501, thereby allowing power generating device 500 to generate larger electric power; however, this structure needs to apply a large force to piezoelectric board 503. In the case that piezoelectric board 503 is made of a piezoelectric ceramic material, a fragile material, the above structure may produce cracks on board 503 during operation, so that a decrease in electric power energy can be invited. When piezoelectric power generating device 500 is used as an energy-harvester for eliminating batteries and wirings, it is crucial to acquire a long-term reliability.

PTL 2 discloses a piezoelectric power generating device in which only compressive stress is applied to a piezoelectric since piezoelectric ceramic material has a smaller rigidity to tensile stress than to compressive stress.

CITATION LIST

Patent Literature

PTL 1: Japanese Patent No. 4259458
PTL 2: International Publication No. 2010/029715

SUMMARY

A power-generating device includes a vibration plate, a lower electrode on the vibration plate, a piezoelectric layer made of piezoelectric material on the lower electrode, and an upper electrode on the piezoelectric layer, a fixing member for supporting a fixed end of the vibration plate. The vibration plate applies compressive stress to the piezoelectric layer when the vibration plate does not vibrate.

The power generating device is excellent in long-term reliability.

DETAIL DESCRIPTION OF PREFERRED EMBODIMENT

Figure 1A:
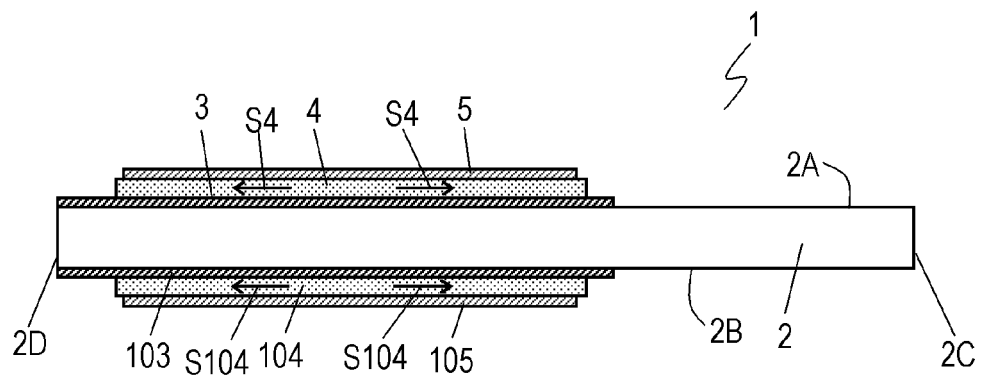
FIG. 1A is a side view of a piezoelectric power-generating transducer in accordance with an exemplary embodiment of the present invention.
Figure 1B:
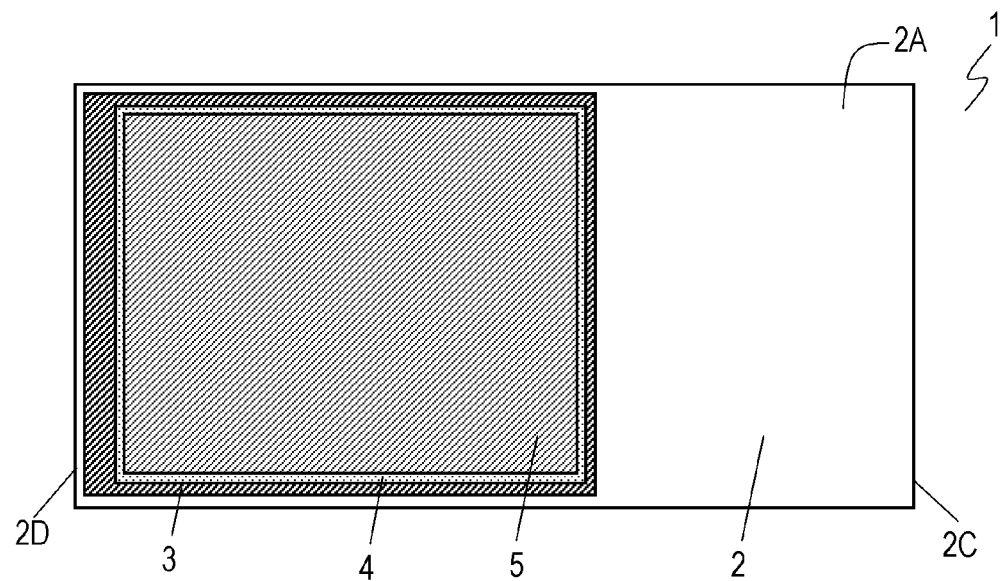
FIG. 1B is a plan view of the piezoelectric power-generating transducer in accordance with the embodiment.

FIGS. 1A and 1B are a side view and a plan view of piezoelectric power-generating transducer 1 in accordance with an exemplary embodiment of the present invention. Piezoelectric power-generating transducer 1 includes vibration plate 2 having main surfaces 2A and 2B opposite to each other, lower electrode 3 disposed on main surface 2A of vibration plate 2, piezoelectric layer 4 disposed on lower electrode 3, upper electrode 5 disposed on piezoelectric layer 4 to face lower electrode 3 across piezoelectric layer 4, lower electrode 103 disposed on main surface 2B of vibration plate 2, piezoelectric layer 104 disposed on lower electrode 103, and upper electrode 105 disposed on piezoelectric layer 104 to face lower electrode 103 across piezoelectric layer 104. Vibration plate 2 is made of metal material. Piezoelectric power-generating transducer 1 converts mechanical energy, such as vibration, distortion, and deformation of vibration plate 2, into electric energy by using piezoelectric effect and outputs the electric energy. Vibration plate 2 has free end 2C and fixed end 2D opposite to each other. Free end 2C and fixed end 2D constitute both ends of each of main surfaces 2A and 2B. Fixed end 2D is configured to be fixed. Free end 2C is fixed to nothing and has a position changeable. Vibration plate 2 is configured to vibrate in a direction perpendicular to main surfaces 2A and 2B while fixed end 2D is fixed and free end 2C has a changeable position. As shown in FIG. 1B, piezoelectric layer 4 (104) is smaller than lower electrode 3 (103), and upper electrode 5 (105) is smaller than piezoelectric layer 4 (104). This structure exposes an outer periphery of lower electrode 3 (103) from piezoelectric layer 4 (104), and exposes an outer periphery of piezoelectric layer 4 (104) from upper electrode 5 (105).

A method for manufacturing piezoelectric power-generating transducer 1 will be described below.

A heat-resistant stainless plate, such as US430, is prepared as vibration plate 2. This heat-resistant stainless plate has a thickness of 0.20 mm and contains a small amount of aluminum. Vibration plate 2 has a width of 10.5 mm, and a length of 19.0 mm.

Lower electrodes 3 and 103 are formed by screen-printing a paste made of Ag—Pd alloy onto main surfaces 2A and 2B of vibration plate 2, respectively. Piezoelectric layers 4 and 104 are formed by metal-mask printing a printing paste on lower electrode 3 and 103, respectively. This printing paste contains piezoelectric-material composition powder. On top of that, upper electrodes 5 and 105 are formed by screen-printing an Ag—Pd alloy paste onto piezoelectric layers 4, 104, respectively, thereby producing unsintered element. Each of lower electrode 3, piezoelectric layer 4, and upper electrode 5 has a width of about 10.0 mm and a length of about 10.00 mm.

The unsintered element is disposed in a firing shell, and fired in an electric oven at 875° C. for 2 hours, thereby firing and densifying lower electrodes 3 and 103, piezoelectric layers 4 and 104, and upper electrodes 5 and 105 to be integrated with vibration plate 2, thereby producing a sintered element. After the firing, piezoelectric layers 4 and 104 has a thickness of 25 μm. Each of lower electrodes 3 and 103 and upper electrodes 5 and 105 has a thickness of 5 μm. Piezoelectric layers 4 and 104 as the unsintered element in the paste, is fired and solidified to be the sintered element. A heat expansion coefficient of vibration plate 2 is larger than that of each of piezoelectric layers 4 and 104, so that, when the sintered element is cooled and has a room temperature, vibration plate 2 made of metal is contracted in a larger amount than the solidified piezoelectric layers 4 and 104. This mechanism applies compressive stresses S4 and S104 to piezoelectric layers 4 and 104 in a direction parallel to main surfaces 2A and 2B, respectively.

Figure 2:
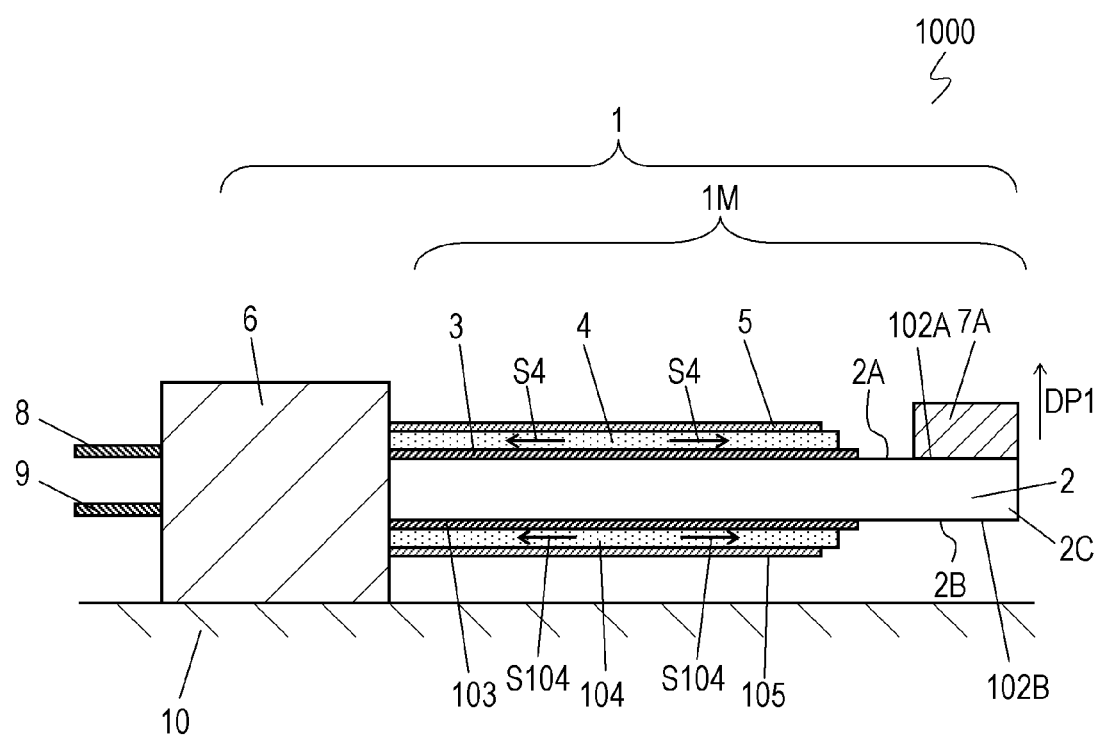
FIG. 2 is a side view of the power-generating device in accordance with the embodiment.

The sintered element is disposed in a thermostatic bath having a temperature maintained at 120° C., and a voltage of 100V (4 kV/mm) is applied for 30 minutes via upper electrodes 5 and 105 and lower electrodes 3 and 103 to piezoelectric layers 4 and 104, thereby polarizing piezoelectric layers 4 and 104 in directions opposite to each other with respect to vibration plate 2. That is, as shown in FIG. 2, piezoelectric layer 4 and 104 opposite to each other with respect to vibration plate 2 are polarized in a predetermined direction, namely, in direction DP1 or a direction opposite to direction DP1. While vibrating, vibration plate 2 deforms, such that main surface 2B expands when main surface 2A contracts. Main surface 2B contracts when main surface 2A expands. While vibration plate 2 deforms, the polarization generates voltages at piezoelectric layers 4 and 104 having opposite polarities. A voltage between lower electrode 3 and upper electrode 5 and a voltage between lower electrode 103 and upper electrode 105 can be summed to each other and the summed voltage is taken out, thus providing a voltage which is about twice higher than a voltage generated by a piezoelectric power-generating transducer in which a piezoelectric layer is disposed on only a single surface of a vibration plate.

Piezoelectric layer 4 is made of piezoelectric material which is preferably fired densely at a relatively low temperature in order to be simultaneously fired with a material of the electrodes, and preferably has a composition excellent in piezoelectric properties. The piezoelectric material of piezoelectric power-generating transducer 1 in accordance with the embodiment has the composition expressed in the formula below:

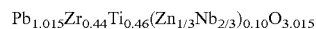

$$Pb_{1.015}Zr_{0.44}Ti_{0.46}(Zn_{1/3}Nb_{2/3})_{0.10}O_{3.015}$$

This composition exhibits excellent piezoelectric properties, and lead-zirconate-titante (PZT) is replaced at B-site with $Pb(Zn_{1/3}Nb_{2/3})O_3$ by 10 mol %. Pb-site ratio is 1.015 is larger than stoichiometry.

Piezoelectric material composition powder having the molecular ratio expressed in the above formula is produced by a solid phase method using materials including powders of lead-oxide (PbO), titanium dioxide ($TiO_2$), zirconium dioxide ($ZrO_2$), zinc oxide (ZnO), and niobium oxide ($Nb_2O_5$). The purities of these materials are not smaller than 99.9%. The foregoing powders are crushed into grains having an average size (D50) smaller than 0.5 μm in order to fire piezoelectric layers 4 and 104 densely at a temperature lower than 900° C.

The piezoelectric properties of the piezoelectric material thus produced are measured according to a method described in JEITA EM-4501. The mechanical coupling coefficient kp is 0.60. The piezoelectric constant d31 is −125 pm/V. The relative dielectric constant $\in_{33}/\in_0$ is 1250 (excellent among others)

Next, a method for producing a printing paste that contains the piezoelectric material composition powder will be described below. An organic vehicle is produced by preparing an organic binder and a solvent mixed at a ratio of, for instance, 2:8. The organic binder can employ, e.g. ethyl cellulose resin, acrylic resin, or butyral resin. The solvent can employ, e.g. α-terpineol, butyl carbinol. The organic vehicle and the piezoelectric material composition powder are weighed at a ratio of, for instance, 20:80, and then, an appropriate amount of phosphate ester-based dispersant is mixed therewith. The resultant product is kneaded with a three ball-mill, thereby providing the printing paste.

Electrode material of lower electrode 3 and upper electrode 5 can employ paste of silver-vanadium alloy (90% of silver, 10% of vanadium, average grain size of 0.9 μm).

Heat treatments, such as the firing step, produces residual stress on the surface of piezoelectric layer 4, and the residual stress is measured by an X-ray diffraction method. To be more specific, upper electrode 5 is removed by polishing piezoelectric power-generating transducer 1 which is fired and polarized, thereby exposing the surface of piezoelectric layer 4. Then, the surface is measure in crystal lattice intervals by the X-ray diffraction method for finding the residual stress. The residual stress is found from Miller index (111) at its peak appearing around diffraction angle 2θ=38°, then it is found that the compressive stress of about 450 MPa is applied to the surface of piezoelectric layer 4. This is caused by a larger thermal expansion coefficient of the heat-proof stainless plate than that of the piezoelectric material. To be more specific, the PTZ-based piezoelectric material has the thermal expansion coefficient of 5 ppm/K in average from the normal temperature to the firing temperature of 900° C., while the heat resistant stainless plate that forms vibration plate 2 has a larger thermal expansion coefficient of 12 ppm/K in average.

Since the ceramic material has a small rigidity to tensile stress, the PTZ-based material can be broken by the tensile stress ranging from 100 to 150 Mpa. To obtain a power-generating device excellent in long-term reliability, the piezoelectric material needs to avoid receiving the tensile stress. Alternately, the tensile stress is limited to several tens MPa to prevent the piezoelectric material from receiving a large tensile stress.

Electric work E (J) obtained when stress T (Pa) is applied to a piezoelectric member can be calculated rhetorically by equation (1) with the piezoelectric member made of piezoelectric material having piezoelectric constant d31 (m/V), dielectric constant $\epsilon_{33}$ (N/V$^2$), and having a width of w (m) and a thickness of t (m):

$$E = \frac{1}{2} \frac{d_{31}^2}{\varepsilon_{33}} T^2 (wLt) \quad (1)$$

Following values are substituted into equation (1) to find a relation between electric work E (J) and stress T (Pa). Those values are material properties of piezoelectric layers 4 and 104 in accordance with the embodiment: piezoelectric constant d31 (−125 pm/V); relative dielectric constant $\epsilon_{33}/\epsilon_0$ (1250); width w (10 mm) of piezoelectric layers 4 and 104; a length L (10 mm of piezoelectric layers 4 and 104); and a total thickness t (50 μm=25 μm×2) of piezoelectric layers 4 and 104. As a result, stress T of 100 MPa produces electric work E of 0.35 μJ. Stress T of 200 MPa produces electric work E of 141 μJ. Stress T of 400 MPa produces electric work E of 564 μJ.

Predetermined compressive stresses S4 and S104 are applied to piezoelectric layers 4 and 104, respectively, when no displacement, such as warping, occurs in vibration plate 2 of piezoelectric power-generating transducer 1, namely when none of external force and vibration is applied to layers 4 and 104. Therefore, the tensile stress produced at vibration plate 2 of piezoelectric power-generating transducer 1 is not larger than compressive stresses S4 and S104 during the power generation, thereby preventing the tensile stress from acting theoretically on piezoelectric power-generating transducer 1, so that no cracks occur in piezoelectric layers 4 and 104.

For example, a compressive stress of 450 MPa is applied to piezoelectric layers 4 and 104. A substitution of 450 MPa for stress T in equation (1) results in electric work E=714 μJ. An electric work not smaller than 100 μJ is required for operating a variety of sensors or low-power wireless communication. The electric work E=714 μJ is quite enough for operating such sensors or low-power wireless communication.

Piezoelectric power-generating transducer 1 thus can obtain a large electric work since piezoelectric layers 4 and 104 are provided on main surfaces 2A and 2B of vibration plate 2, respectively. When electric power is generated, vibration plate 2 of piezoelectric power-generating transducer 1 vibrates (deforms) to cause at least one of piezoelectric layers 4 and 104 to expand and receive tensile force (external force). As shown in FIG. 1A, compressive stresses S4 and S104 applied previously to piezoelectric layers 4 and 104 allow the compressive stress to act on piezoelectric layers 4 and 104 even when this tensile force is applied. This mechanism allows piezoelectric power-generating transducer 1 to eliminate cracks on piezoelectric layer 4, thus providing high reliability and a large amount of electric power.

Stress T to be applied to piezoelectric layers 4 and 104 can be found from equation (1) by using necessary electric work E and dimensions (length, width, and thickness) of piezoelectric layers 4 and 104. Compressive stresses S4 and S104 to be applied previously to piezoelectric layers 4 and 104 are determined to exceed the stress T found.

Piezoelectric power-generating transducer 1 in accordance with this embodiment includes vibration plate 2 made of heat-resistant stainless plate; however, the material for vibration plate 2 is not limited to a specific one as long as the material can hold piezoelectric layer 4 that receives compressive stress during a non-vibration period. Piezoelectric power-generating transducer 1 displaces or releases free end 2C of vibration plate 2, thereby allowing vibration plate 2 to produce resonant vibration. Vibration plate 2 is thus preferably made of highly ductile material which hardly breaks due to vibration.

According to this embodiment, residual stress is used for applying compressive stresses S4 and S104 to vibration plate 2 in order to compress piezoelectric layers 4 and 104. The residual stress can be produced by the difference in thermal expansion coefficients between vibration plate 2 and each of piezoelectric layers 4 and 104. The difference is produced in rise and fall of the temperature thereof during the firing. The material for vibration plate 2 is determined considering the difference in the thermal expansion coefficients in addition to the high ductility.

The outer dimensions of piezoelectric power-generating transducer 1 are not limited to the above ones. The outer dimensions of piezoelectric power-generating transducer 1 (vibration plate 2) are determined such that vibration plate 2 can mainly deform elastically due to the vibration applied to transducer 1 when predetermined electric work E is produced.

FIG. 2 is a side view of power-generating device 1000 in accordance with the embodiment. Power-generating device 1000 includes piezoelectric power-generating transducer 1, fixing member 6 for fixing fixed end 2D of vibration plate 2 of piezoelectric power-generating transducer 1, weight 7A provided at free end 2C of vibration plate 2, output terminal 8 connected to lower electrodes 3 and 103 of transducer 1, and output terminal 9 connected to upper electrode 5 and 105. According to this embodiment, weight 7A weighs about 1.0 g. Fixing member 6 is rigidly fixed to fixing portion 10, such as a housing.

Piezoelectric power-generating transducer 1 (vibration plate 2) is fixed by fixing member 6, thus forming a cantilever structure. Fixed end 2D of vibration plate 2 of piezoelectric power-generating transducer 1 is accommodated in fixing member 6. Piezoelectric power-generating transducer 1 (vibration plate 2) fixed by fixing member 6 has a portion exposed from fixing member 6. The exposed portion including free end 2C constitutes free-vibration portion 1M which can vibrate freely, and has a length of 17.0 mm.

Figure 3:
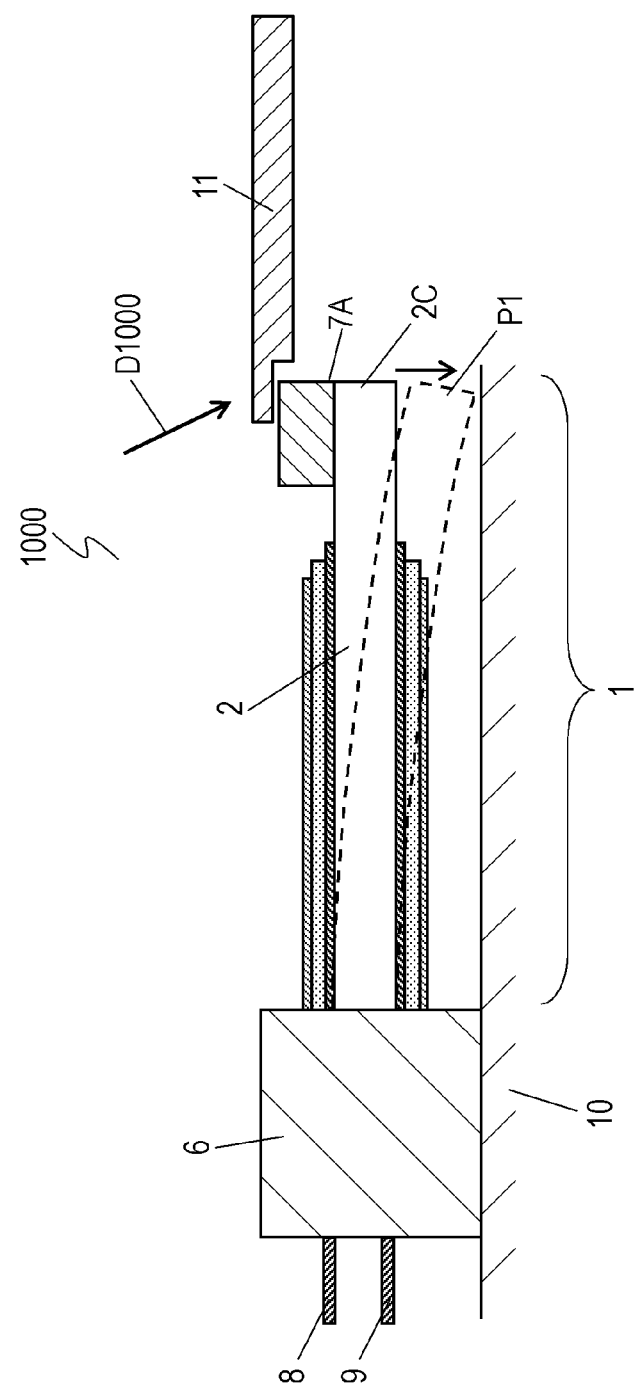
FIG. 3 is a side view of the power-generating device in accordance with the embodiment for illustrating an operation of the power-generating device.

FIG. 3 is a side view of power-generating device 1000 for schematically illustrating an operation of power-generating device 1000. Movable element 11 can be moved by an operator. As shown in FIG. 3, free end 2C of vibration plate 2 of piezoelectric power-generating transducer 1 fixed with fixing member 6 is pushed with movable element 11 in direction D1000, thereby causing vibration plate 2 to deform to be displaced by 1.5 mm. Then, vibration plate 2 is instantaneously released from movable element 11 to jump in reaction, thereby producing a vibration which causes stress. The stress is converted into an electric charge by piezoelectric layers 4 and 104. As a result, a voltage is generated between output terminals 8 and 9.

Movable element 11 can employ a driving mechanism, such as a switch, or a mechanism of rotary, revolving, or reciprocal movement. One of those mechanisms is used as movable element 11 to push piezoelectric power-generating transducer 1 and instantaneously release transducer 1 from movable element 11.

The weight and the location of weight 7A can be factors to adjust a frequency and a duration of the vibration. The weight and the location of weight 7A are determined to obtain a maximum amount of electric power. If a sufficient amount of electric power can be produced by power-generating device 1000, device 1000 may not necessarily include weight 7A.

At least one of weight 7A and movable element 11 can be made of magnetic material, thereby generating the vibration simply and efficiently on vibration plate 2 of piezoelectric power-generating transducer 1. For instance, weight 7A is made of a permanent magnet or an electromagnet, and movable element 11 is made of magnetic material, such as iron, nickel, cobalt, or alloy of these metals. This configuration allows an attractive force produced by magnetic force of weight 7A to cause free end 2C of vibration plate 2 to contact movable element 11 without fail even if vibration plate 2 and movable element 11 are positioned with a certain amount of positional deviation between vibration plate 2 and movable element 11. The contact causes vibration plate 2 to deform. Here is another structure, namely, movable element 11 is made of a magnet while weight 7A is made of magnetic material, or vibration plate 2 is formed of magnetic metal such as iron, nickel, cobalt, or alloy of these metals. This structure provides similar effects.

Both of weight 7A and movable element 11 can be made of magnets so that piezoelectric power-generating transducer 1 can deform and vibrate while piezoelectric power-generating transducer 1 does not contact movable element 11. Weight 7A and movable element 11 are polarized to the same polarity at their surfaces facing each other, so that a repulsion force produced by magnetic force is used for deforming and vibrating piezoelectric power-generating transducer 1 while not contacting.

The deformation of vibration plate 2 during its vibration causes piezoelectric layers 4 and 104 to deform, and allows layers 4 and 104 to generate electric power. In piezoelectric power-generating transducer 1 of power-generating device 1000, end portions 102A and 102B of main surfaces 2A and 2B of vibration plate 2 including free end 2C are exposed from lower electrodes 3 and 103 and piezoelectric layers 4 and 104. End portions 102A and 102B are located away from free end 2C. If vibration plate 2 is long enough, the vicinity of free end 2C is displaced by the vibration; however, the stress is not large enough to act on piezoelectric layers 4 and 104. Portions of the piezoelectric layers disposed near free end 2C thus cannot contribute to the power generation. End portions 102A and 102B of main surfaces 2A, 2B of vibration plate 2 exposed from lower electrodes 3 and 103 and piezoelectric layers 4 and 104 reduce the material cost of lower electrodes 3 and 103 and piezoelectric layers 4 and 104. In piezoelectric power-generating transducer 1 of power-generating device 1000, lower electrodes 3 and 103, piezoelectric layers 4 and 104, and upper electrodes 5 and 105 extend from fixing member 6. A portion of vibration plate 2 closer to fixing member 6 receives larger stress due to the vibration. Thus, lower electrodes 3 and 103, piezoelectric layers 4 and 104, and upper electrodes 5 and 105 are located close to fixing member 6, so that larger stress can act on piezoelectric layers 4 and 104, thereby providing a larger amount of electric power.

Vibration plate 2 is configured to vibrate by having free end 2C be displaced to certain position P1 and then be released. Tensile forces applied to piezoelectric layers 4 and 104 when free end 2C of vibration plate 2 reaches position P1 are smaller than compressive stresses S4 and S104, respectively.

The result of the operation of power-generating device 1000 in accordance with this embodiment will be described below. A force to cause vibration plate 2 to deform as to displace free end 2C of vibration plate 2 of piezoelectric power-generating transducer 1 by 1.5 mm is about 2.5N. The maximum tensile force applied to piezoelectric layers 4 and 104 calculated by numerical simulation under this condition is 370 MPa, which is smaller than compressive stress of 450 MPa applied to the surfaces of piezoelectric layers 4 and 104.

Figure 4:
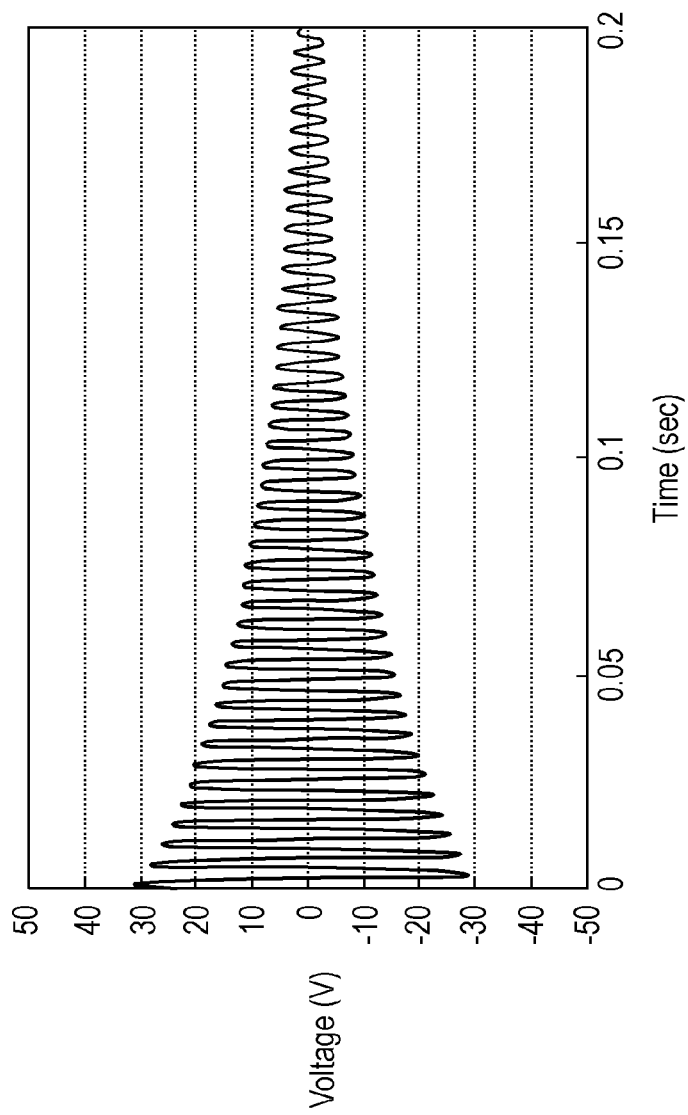
FIG. 4 shows voltages of generated power of the power-generating device in accordance with the embodiment.

FIG. 4 shows voltages generated between output terminals 8 and 9 when vibration plate 2 vibrates by displacing free end 2C of vibration plate 2 by 1.5 mm to cause piezoelectric power-generating transducer 1 to deform and then releasing free end 2C. The voltage shown in FIG. 4 is a voltage between both ends of a load resistance of 20 kΩ connected between output terminals 8 and 9.

As shown in FIG. 4, immediately after the resonance vibration starts, a voltage of ±30V is generated, and decreases to about ±15V in 0.05 second. The voltage then decreases to approx. ±8V in 0.1 second, and then, decreases to about ±2V in 0.2 second. Fourier transformation is performed to the waveform of the voltage and provides a frequency of 215 Hz.

Figure 5:
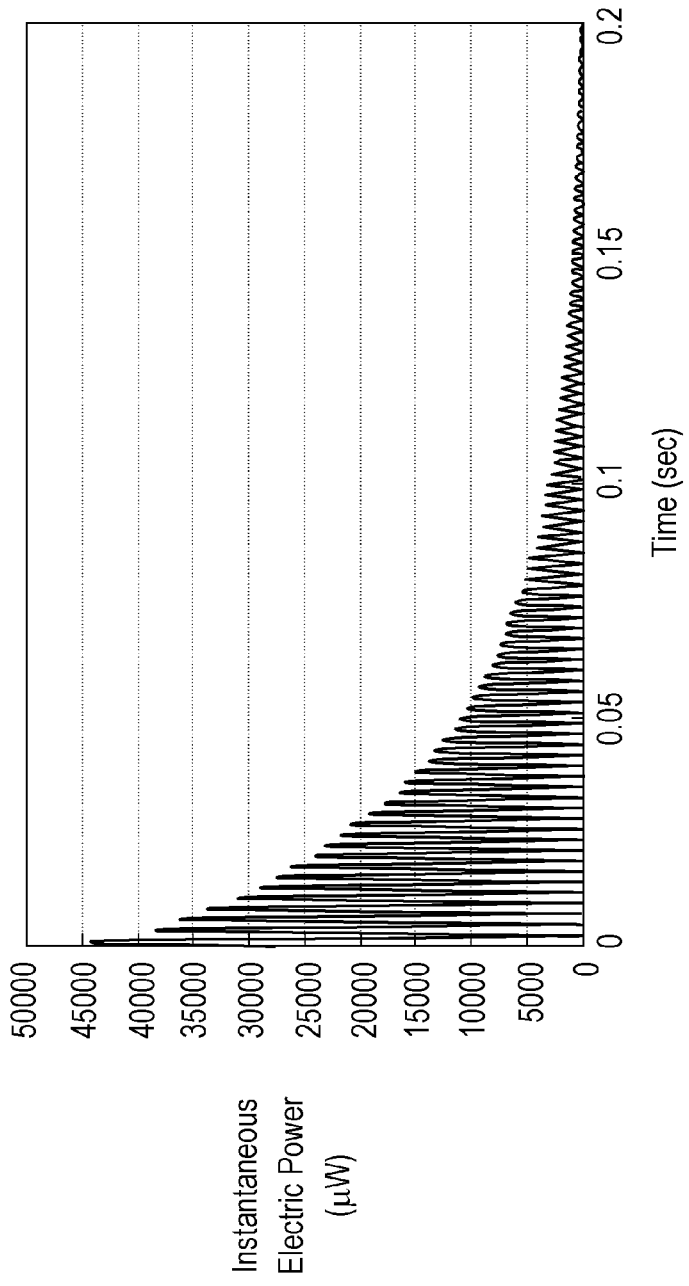
FIG. 5 shows instantaneous electric power generated by the power-generating device in accordance with the embodiment.

An instantaneous electric power generated is calculated based on the voltages shown in FIG. 4 and the load resistance of 20 kΩ, and the calculation result is shown in FIG. 5. The instantaneous electric power shown in FIG. 5 is time-integrated to find electric work (a product of electric power and time) shown in FIG. 6.

Figure 6:
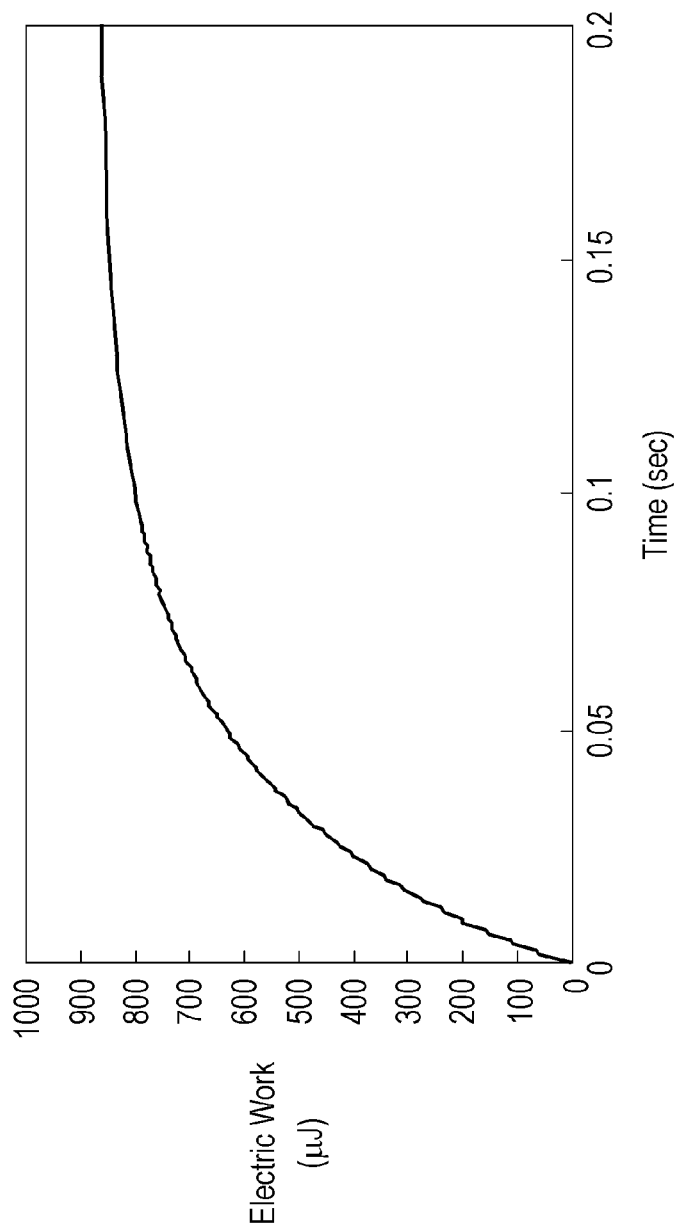
FIG. 6 shows amounts of electric power generated by the power-generating device in accordance with the embodiment.

As shown in FIGS. 5 and 6, immediately after the start of the resonant vibration, electric power larger than 40 mW is generated instantaneously, and the work reaches 860 µJ in 0.2 second. While the calculated value derived from equation (1) is a value obtained when static stress is applied to a piezoelectric material, the amount of electric work actually measured and shown in FIG. 6 is a value obtained when stress caused by vibration is applied to the piezoelectric material. Although these two values are not equal, the values agree well with each other.

The generated electric work shown in FIG. 6 forms alternating-current (AC) power. The AC power is converted into direct-current (DC) power which is more easily to use and be stored in, e.g. a capacitor while some loss is produced. However, this electric power is large enough to operate a variety of sensors consuming low power or a low-power wireless communication.

An operation causing the vibration shown in FIG. 4 is repeated 10,000 times, however, no defects, such as cracks, were found in piezoelectric layer 4, and no significant changes are found in the amount of electric power generated.

Power-generating device 1000 in accordance with the embodiment has a small size of a width of about 10 mm, a length of about 20 mm, and a height of about 5 mm resulting from consideration of a height of weight 7A and displacement caused by vibration. Power-generating device 1000 can generate a large electric work exceeding 800 µJ and is also excellent in a long-term reliability.

Figure 7:
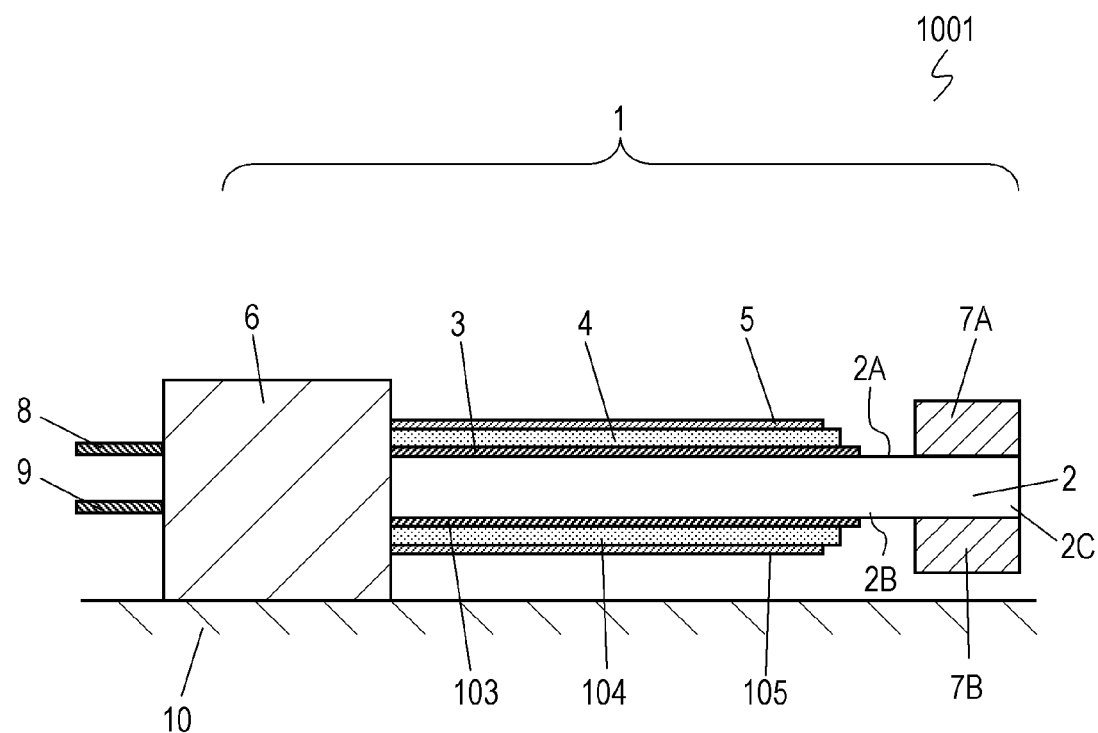
FIG. 7 is a side view of another power-generating device in accordance with the embodiment.

FIG. 7 is a side view of another power-generating device 1001 in accordance with the embodiment. In FIG. 7, components identical to those of power-generating device 1000 shown in FIG. 2 are denoted by the same reference numerals. Power-generating device 1001 shown in FIG. 7 further includes weight 7B on main surface 2B at free end 2C of vibration plate 2. Fixing portion 10 faces free end 2C of vibration plate 2.

In power-generating device 1001, when vibration plate 2 vibrates with a larger amplitude, weight 7B may contacts fixing portion 10. In this case, the amplitude of vibration plate 2 is limited by weight 7B. Upon vibrating with a larger amplitude, vibration plate 2 causes piezoelectric layers 4 and 104 to deform by an excessively large amount, and may break piezoelectric layers 4 and 104. Weight 7B limits the vibration amplitude of vibration plate 2 and prevents piezoelectric layers 4 and 104 from being broken due to the excessive deformation of piezoelectric layers 4 and 104. In this case, at least weight 7B out of weights 7A and 7B may be made of elastic material (magnetic material), such as plastic magnet. This configuration prevents weight 7B from breaking fixing portion 10.

Figure 8:
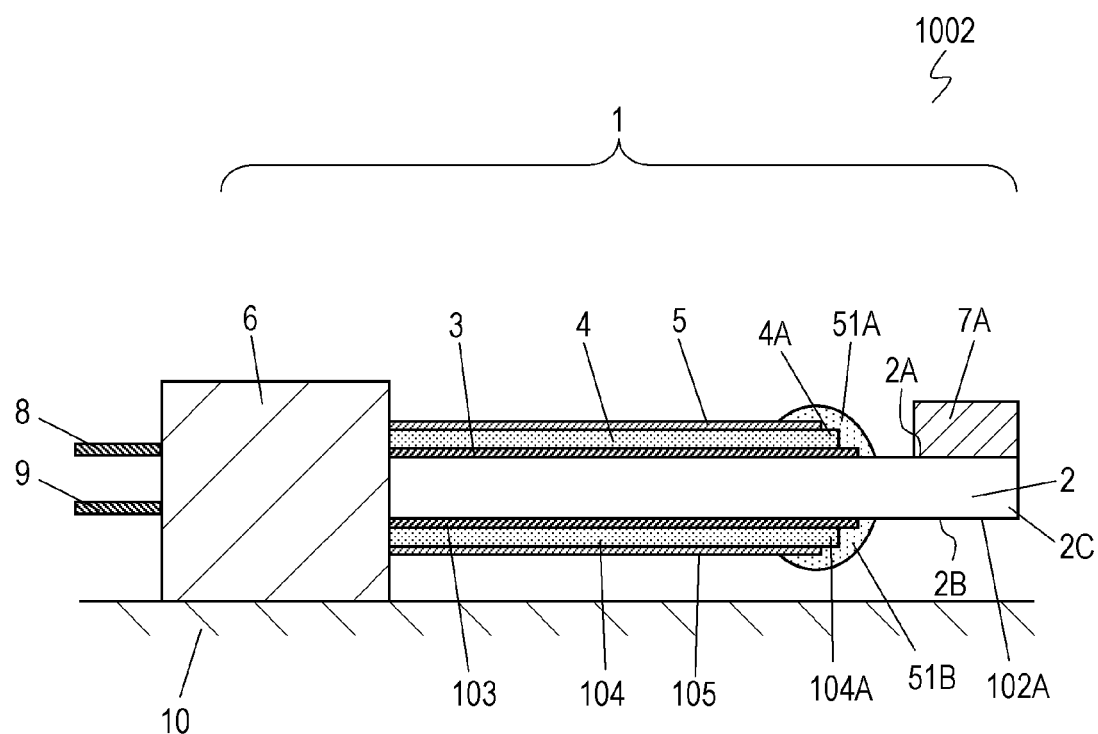
FIG. 8 is a side view of still another power-generating device in accordance with the embodiment.

FIG. 8 is a side view of still another power-generating device 1002 in accordance with the embodiment. In FIG. 8, components identical to those of power-generating device 1000 shown in FIG. 2 are denoted by the same reference numerals. Power-generating device 1002 shown in FIG. 8 further includes coatings 51A and 51B. Coating 51A completely covers end portion 4A of piezoelectric layer 4 which is exposed from upper electrode 5 and which extends toward free end 2C of piezoelectric layer 4. Coating 51B completely covers end portion 104A of piezoelectric layer 104 which is exposed from upper electrode 105 and which extends toward free end 2C of piezoelectric layer 104. Coatings 51A and 51B can be formed by, for instance, screen-printing an epoxy resin paste and hardening the printed resultant paste at a temperature of 150° C. for 30 minutes. This configuration prevents piezoelectric layers 4 and 104 from being peeled off from lower electrodes 3 and 103.

Figure 9:
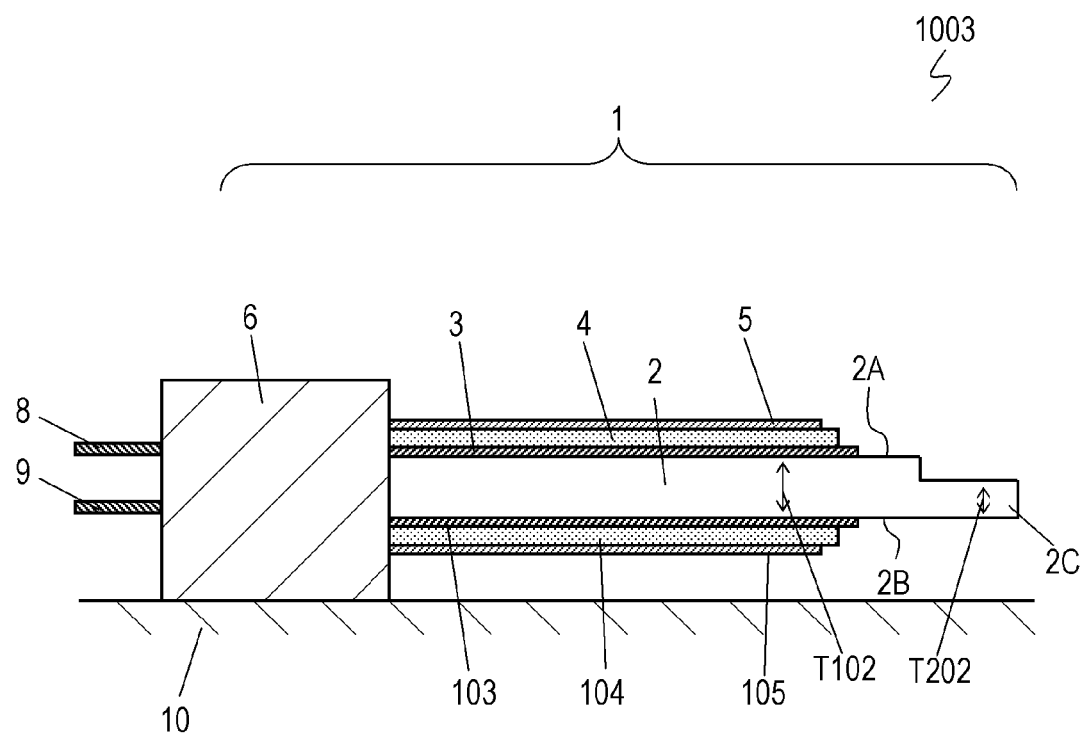
FIG. 9 is a side view of a further power-generating device in accordance with the embodiment.

FIG. 9 is a side view of further power-generating device 1003 in accordance with the embodiment. In FIG. 9, components identical to those of power-generating device 1000 shown in FIG. 2 are denoted by the same reference numerals. Power-generating device 1003 shown in FIG. 9 does not include weight 7A included in power-generating device 1000 shown in FIG. 2. In power-generating device 1003 shown in FIG. 9, a thickness of an end portion of vibration plate 2 including free end 2C is smaller than a thickness at a portion of vibration plate 2 on which piezoelectric layers 4 and 104 are provided. This structure allows free end 2C of vibration plate 2 to be displaced easily, so that vibration plate 2 can vibrate and deform more easily.

Figure 10:
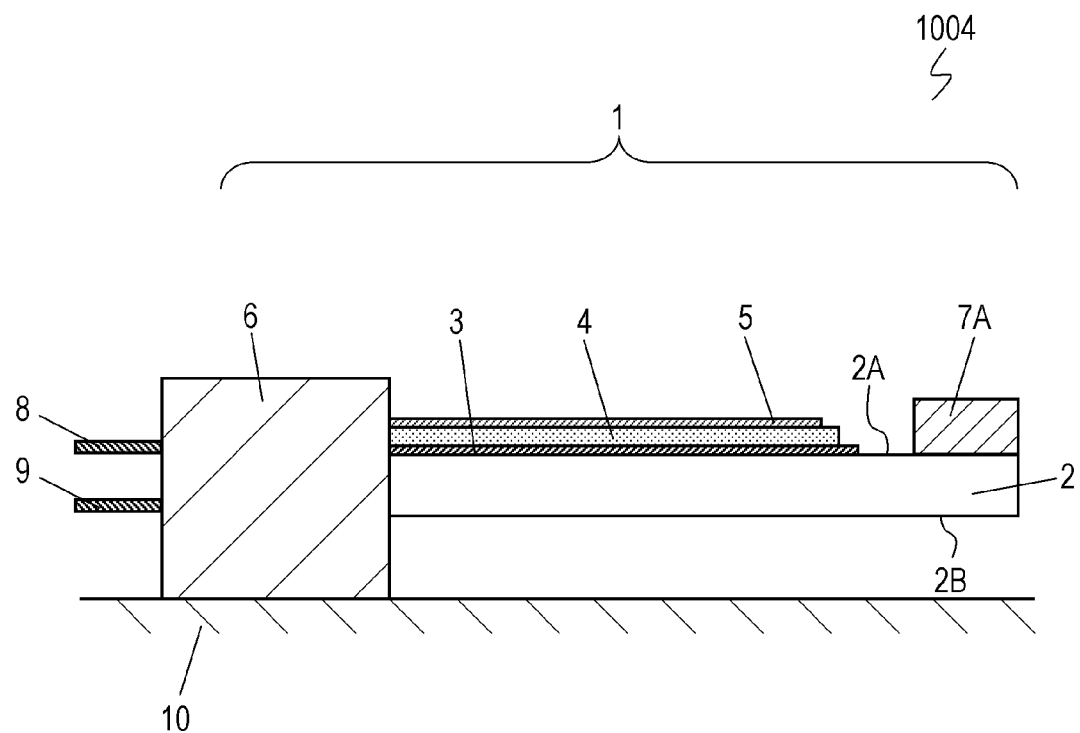
FIG. 10 is a side view of a further power-generating device in accordance with the embodiment.
Figure 11:
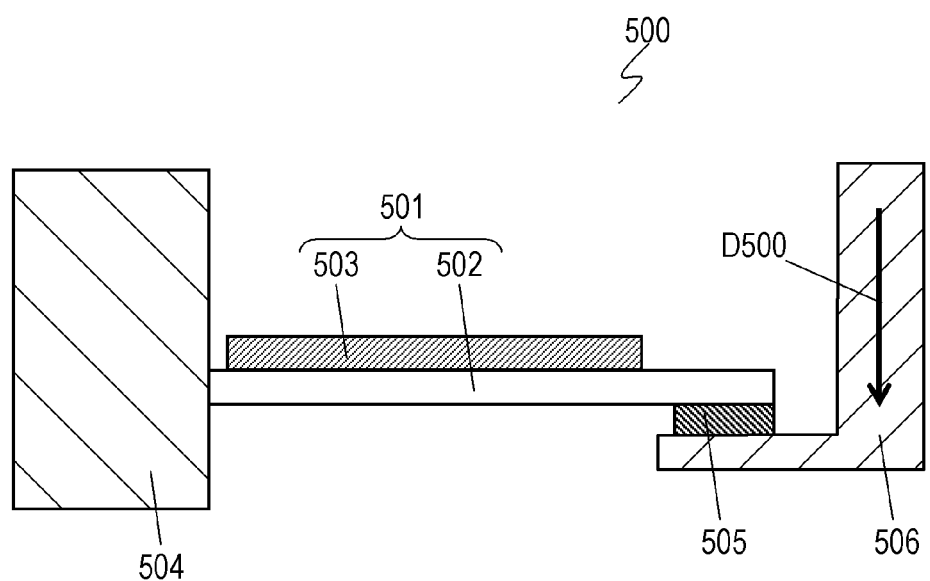
FIG. 11 is a side view of a conventional power-generating device.

FIG. 10 is a side view of further power-generating device 1004 in accordance with the embodiment. In FIG. 10, components identical to those of power-generating device 1000 shown in FIG. 2 are denoted by the same reference numerals. In power-generating device 1004 shown in FIG. 10, piezoelectric power-generating transducer 1 include none of lower electrode 103, piezoelectric layer 104, and upper electrode 105 which are provided on main surface 2B of vibration plate 2 of power-generating device 1000 shown in FIG. 2. The structure for providing compressive stress applied by vibration plate 2 can be also applied to power-generating device 1004 that includes lower electrode 3, piezoelectric layer 4, and upper electrode 5 only on one main surface 2A, providing the same effects. Weight 7B shown in FIG. 7B may be disposed on main surface 2B of power-generating device 1004.

INDUSTRIAL APPLICABILITY

A power-generating device according to the present invention can be used as a self-support power supply utilizing mechanical energy for operating, e.g. switches.

REFERENCE MARKS IN THE DRAWINGS 1 piezoelectric power-generating transducer
2 vibration plate
2A main surface (first main surface)
2B main surface (first main surface)
2C free end
2D fixed end
3 lower electrode (first lower electrode)
4 piezoelectric layer (first piezoelectric layer)
5 upper electrode (first upper electrode)
6 fixing member
7A weight (first weight)
7B weight (second weight)
8 output terminal (first output terminal)
9 output terminal (second output terminal)
10 fixing portion
11 movable element
51A coating (first coating)
51B coating (second coating)
103 lower electrode (second lower electrode)
104 piezoelectric layer (second piezoelectric layer)
105 upper electrode (second upper electrode)

The invention claimed is:

1. A power-generating device comprising:
a piezoelectric power-generating transducer including:
a single metal plate made of stainless steel and having a free end, a fixed end and a first main surface,
a first lower electrode disposed on the first main surface of the metal plate and having a surface in parallel with the first main surface,
a first piezoelectric layer made of piezoelectric material and disposed on the first lower electrode, and
a first upper electrode disposed on the first piezoelectric layer to face the first lower electrode across the first piezoelectric layer;
a fixing member supporting the fixed end of the metal plate;
a first output terminal connected to the first lower electrode; and
a second output terminal connected to the first upper electrode, wherein the power-generating transducer is configured to vibrate in a direction perpendicular to the first main surface, wherein the metal plate applies first compressive stress to the first piezoelectric layer when the power-generating transducer does not vibrate, wherein a direction of the first compressive stress is in parallel with the surface of the lower electrode, wherein an end portion of the first main surface of the metal plate at the free end of the metal plate is exposed from the first lower electrode, wherein the first piezoelectric layer has a portion exposed from the first upper electrode, and wherein the piezoelectric power-generating transducer further includes a first coating covering the exposed portion of the first piezoelectric layer.

2. The power-generating device according to claim 1, wherein the piezoelectric power-generating transducer further includes a first weight disposed on the first main surface of the metal plate at the free end of the metal plate.

3. The power-generating device according to claim 2, wherein the first weight is made of magnetic material.

4. The power-generating device according to claim 2,
wherein the metal plate further has a second main surface opposite to the first main surface, and
wherein the piezoelectric power-generating transducer further includes a second weight disposed on the second main surface of the metal plate at the free end of the metal plate.

5. The power-generating device according to claim 1, wherein an end portion of the first main surface of the metal plate at the free end of the metal plate has a thickness smaller than a thickness of a portion of the metal plate on which the first lower electrode is disposed.

6. The power-generating device according to claim 1,
wherein the power-generating transducer is configured to vibrate by releasing the free end of the metal plate after displacing the free end of the metal plate to a certain position, and
wherein, when the free end of the metal plate is located at the certain position, the first piezoelectric layer receives tensile force smaller than the first compressive stress.

7. The power-generating device according to claim 1, further comprising a movable element of configured to displace the free end of the metal plate, and then, to release the free end of the metal plate as to cause the power-generating transducer to vibrate.

8. The power-generating device according to claim 1,
wherein the metal plate further has a second main surface opposite to the first main surface,
wherein the piezoelectric power-generating transducer further includes:
a second lower electrode disposed on the second main surface of the metal plate;
a second piezoelectric layer made of piezoelectric material and disposed on the second lower electrode; and
a second upper electrode disposed on the second piezoelectric layer to face the second lower electrode across the second piezoelectric layer, and
wherein the metal plate applies second compressive stress to the second piezoelectric layer when the power-generating transducer does not vibrate.

9. The power-generating device according to claim 8, wherein the first piezoelectric layer and the second piezoelectric layer are polarized in an identical direction,
wherein the first output terminal is connected to the first upper electrode and the second upper electrode, and
wherein the second output terminal is connected to the first lower electrode and the second lower electrode.

10. The power-generating device according to claim 8, wherein a direction of the second compressive stress is in parallel with the second main surface of the metal plate.

11. The power-generating device according to claim 8, wherein the piezoelectric power-generating transducer further includes a first weight disposed on the first main surface of the metal plate at the free end of the metal plate.

12. The power-generating device according to claim 11, wherein the piezoelectric power-generating transducer further includes a second weight disposed on the second main surface of the metal plate at the free end of the metal plate.

13. The power-generating device according to claim 12, wherein the second weight is made of elastic material.

14. The power-generating device according to claim 8,
wherein the second piezoelectric layer includes a portion exposed from the second upper electrode, and
wherein the piezoelectric power-generating transducer further includes a second coating covering the exposed portion of the second piezoelectric layer.

15. The power-generating device according to claim 8,
wherein the power-generating transducer is configured to vibrate by releasing the free end of the metal plate after displacing the free end the metal plate to a certain position,
wherein, when the free end of the metal plate is placed at the certain position, the first piezoelectric layer receives tensile force smaller than the first compressive stress, and
wherein, when the free end of the metal plate is at the certain position, the second piezoelectric layer receives tensile force smaller than the second compressive stress.

16. The power-generating device according to claim 1, further comprising:
a limitation part that limits a vibration of the metal plate,
wherein, when the power-generating transducer vibrates in a moving range limited by the limitation part, the first piezoelectric layer receives tensile force smaller than the residual compressive stress.

17. The power-generating device according to claim 1, wherein a thickness of the metal plate is larger than a thickness of the piezoelectric layer.

18. A power-generating device comprising:
a piezoelectric power-generating transducer including:
a single metal plate made of stainless steel and having a free end, a fixed end and a first main surface,
a first lower electrode disposed on the first main surface of the metal plate and having a surface in parallel with the first main surface,
a first piezoelectric layer made of piezoelectric material and disposed on the first lower electrode, and
a first upper electrode disposed on the first piezoelectric layer to face the first lower electrode across the first piezoelectric layer;
a fixing member supporting the fixed end of the metal plate;
a first output terminal connected to the first lower electrode; and
a second output terminal connected to the first upper electrode,
wherein the power-generating transducer is configured to vibrate in a direction perpendicular to the first main surface, wherein the metal plate applies first compressive stress to the first piezoelectric layer when the power-generating transducer does not vibrate, wherein a direction of the first compressive stress is in parallel with the surface of the lower electrode, and wherein the upper electrode has an exposed surface opposite to a lower surface in contact with the first piezoelectric layer.

19. A power-generating device comprising:

a piezoelectric power-generating transducer including:
- a vibration plate having a free end, a fixed end and a main surface, the vibration plate being configured to vibrate in a direction perpendicular to the main surface,
- a lower electrode disposed on the main surface of the vibration plate,
- a piezoelectric layer made of piezoelectric material and disposed on the lower electrode, and
- an upper electrode disposed on the piezoelectric layer to face the lower electrode across the piezoelectric layer;

a fixing member supporting the fixed end of the vibration plate;

an output terminal connected to the lower electrode; and a second output terminal connected to the upper electrode, wherein the vibration plate applies compressive stress to the piezoelectric layer when the vibration plate does not vibrate, and wherein the piezoelectric layer has an exposed portion at a part of an upper surface and a side surface of the piezoelectric layer exposed from the upper electrode.

20. The power-generating device according to claim 19, wherein the piezoelectric power-generating transducer further includes a coating material covering the exposed portion of the piezoelectric layer.

\* \* \* \* \*